United States Patent [19]
ElHatem et al.

[11] Patent Number: 5,699,231
[45] Date of Patent: Dec. 16, 1997

[54] METHOD OF PACKAGING HIGH VOLTAGE COMPONENTS WITH LOW VOLTAGE COMPONENTS IN A SMALL SPACE

[75] Inventors: Abdul M. ElHatem, Redondo Beach, Calif.; Mohammad M. Mojarradi, Pullman, Wash.

[73] Assignee: Xerox Corporation, Stanford, Conn.

[21] Appl. No.: 562,615

[22] Filed: Nov. 24, 1995

[51] Int. Cl.$^6$ ........................................... H05K 5/00
[52] U.S. Cl. ........................ 361/752; 174/260; 174/261
[58] Field of Search ............................ 174/52.1, 52.2, 174/52.3, 254, 260, 261, 262, 266; 361/220, 226, 228, 728, 736, 748, 752, 760, 777, 778, 783, 782, 807, 809, 816, 749; 439/68, 83

[56] References Cited

U.S. PATENT DOCUMENTS

| | | | |
|---|---|---|---|
| 3,753,046 | 8/1973 | Towell | 361/777 |
| 5,394,301 | 2/1995 | Fassel et al. | 174/252 |

FOREIGN PATENT DOCUMENTS

| | | | |
|---|---|---|---|
| 4-129255 | 4/1992 | Japan | 361/720 |

Primary Examiner—Donald Sparks
Attorney, Agent, or Firm—Nola Mae McBain

[57] ABSTRACT

An electronic circuit package in which several high voltage components are packaged along with low voltage components using standard circuit boards and minimizing the space needed for the entire assembly. A miniature circuit board, constructed of standard circuit board material, is used to mount several electronic components, some of which require high voltages. To meet isolation requirements, requiring a dielectric strength more than that provided by the board itself, between the high and low voltage nodes the circuit board incorporates slots or other cut out shapes in the board. The slots or other cut out shapes provide two functions. The first use for the slots or other cut out shapes is to prevent charge migration on the surface of the board between high and low voltage nodes. This is accomplished by placing the slots or other cut out shapes between high and low voltage nodes. The circuit board is then encapsulated within a potting material. The slots or other cut out shapes perform a second function of allowing the potting material to flow around and through the board to facilitate full encapsulation of the board and the electronic devices on the board. Several of the slots or other cut out shapes are placed in the board directly underneath the electronic devices mounted on the board to aid in allowing the potting material to completely surround and encapsulate the electronic devices.

1 Claim, 5 Drawing Sheets

METHOD OF PACKAGING HIGH VOLTAGE COMPONENTS WITH LOW VOLTAGE COMPONENTS IN A SMALL SPACE

BACKGROUND

This invention relates generally to packaging high voltage devices and more particularly concerns packaging an array of high voltage devices along with low voltage devices while using a minimal amount of space and standard circuit boards. Packaging multiple high voltage devices or packaging high voltage devices along with low voltage devices is difficult due to isolation requirements between the devices. Standard circuit boards do not have the dielectric strength to support the isolation requirements in small areas.

Accordingly, it is the primary aim of the invention to extend standard printed wiring board material voltage support properties.

Further advantages of the invention will become apparent as the following description proceeds.

SUMMARY OF THE INVENTION

Briefly stated and in accordance with the present invention, there is provided an electronic circuit package with a circuit board having a top surface, where high voltage components and low voltage components are attached to the circuit board and spaced from the top surface. The circuit board has at least one opening beneath each high voltage component and each low voltage component, and has at least one opening between each high voltage component and each low voltage component to prevent charge migration. The circuit board is located within a housing, and the housing is filled with potting material where the potting material completely surrounds the circuit board, the high voltage components and the low voltage components. The potting material also extends through each of the openings in the circuit board and completely fills the space between the top surface of the circuit board and said at least one high voltage component and completely between said top surface of said circuit board and said at least one low voltage component whereby each component is encapsulated by said potting material and each at least one high voltage component and at least one low voltage component are electrically isolated from each other.

Figure 1:
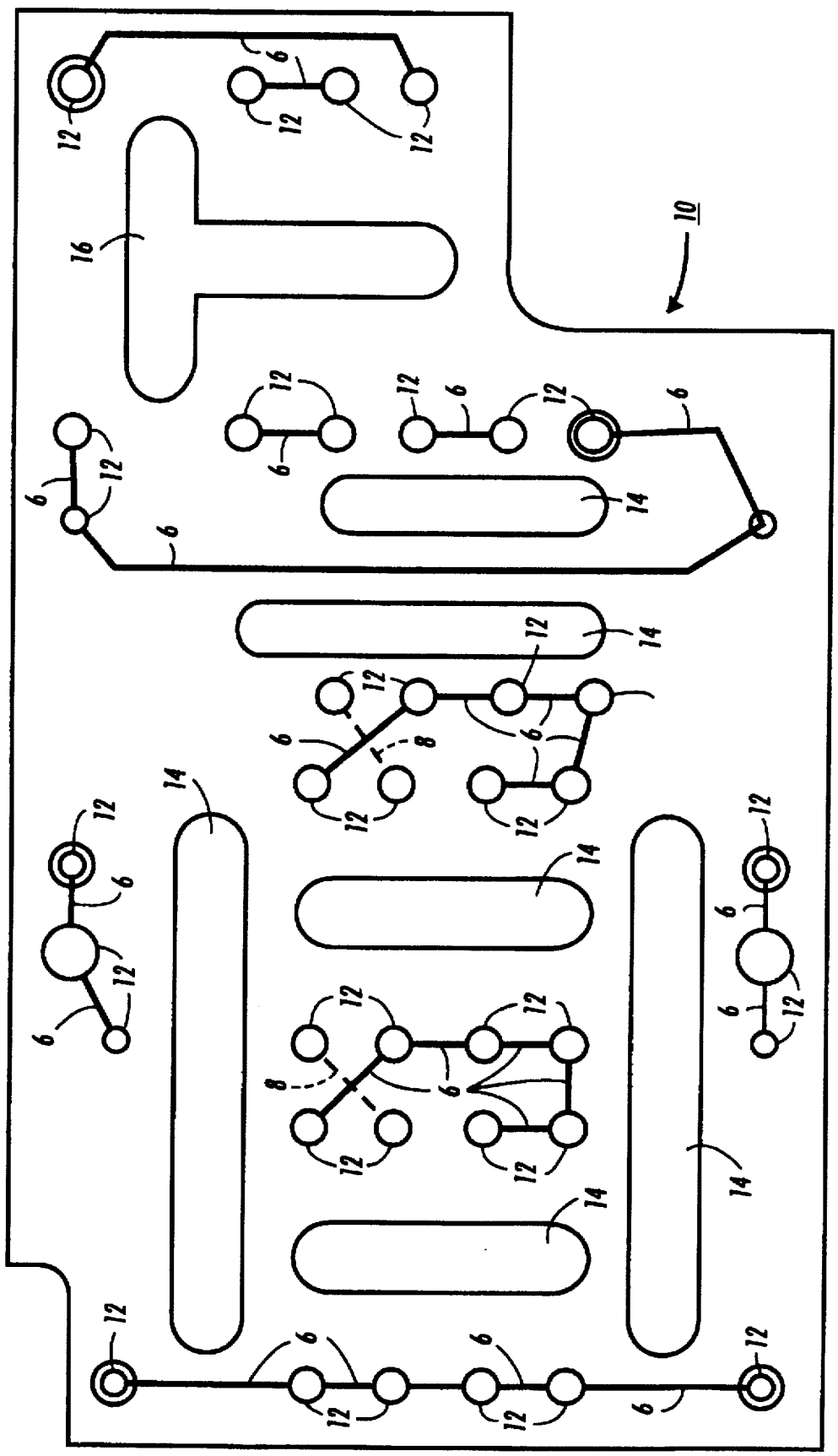
FIG. 1 is a top view of a circuit board.

While the present invention will be described in connection with a preferred embodiment and method of use, it will be understood that it is not intended to limit the invention to that embodiment or procedure. On the contrary, it is intended to cover all alternatives, modifications and equivalents as may be included within the spirit and scope of the invention as defined by the appended claims.

Alpha-Numeric List of Elements
 front side metal interconnect lines 6
 back side metal interconnect lines 8
 circuit board 10
 holes 12
 elongated holes 14
 t-shaped hole 16
 diode 20
 diode 22
 diode 24
 diode 26
 optoisolator 28
 chip module 30
 chip module 32
 chip module 34
 lead 36
 lead 38
 lead 40
 lead 42
 lead 44
 lead 46
 lead 48
 lead 50
 lead 52
 lead 58
 lead 60
 lead 62
 lead 64
 lead 66
 lead 68
 lead 70
 lead 72
 lead 74
 lead 76
 lead 78
 lead 80
 lead 82
 lead 84
 lead 86
 lead 88
 lead 90
 lead 92
 lead 94
 lead 96
 lead 98
 housing 100
 wire 102
 wire 104
 wire 106
 wire 108
 notch 110
 notch 112

DETAILED DESCRIPTION OF THE INVENTION

Turning now to FIG. 1, a circuit board 10 is shown. The circuit board 10 has a number of small round through holes 12, elongated holes 14, and one t-shaped hole 16. Each of these different types of holes 12, 14, 16 will perform different functions in the final assembly. Also shown on the circuit board 10 are front side metal interconnect lines 6 and back side metal interconnect lines 8.

Figure 2:
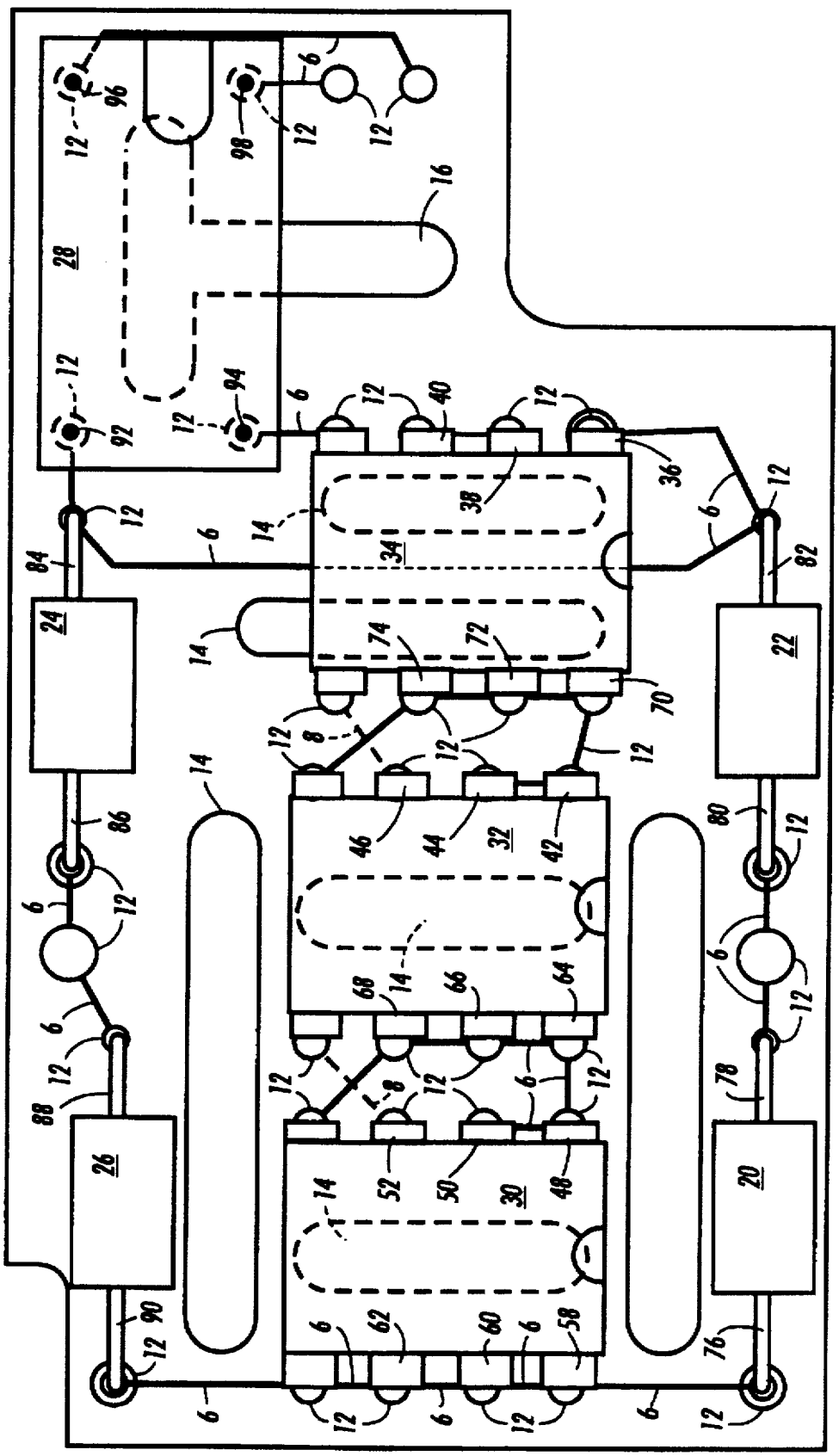
FIG. 2 is a top view of the circuit board of FIG. 1 with electrical components attached.

FIG. 2 shows the circuit board 10 of FIG. 1 with electrical components inserted into the circuit board 10. Diodes 20, 22, 24, 26 have been inserted into the board along with optoisolator 28 and chip modules 30, 32, 34. The through holes 12 were used to insert leads from the electrical components through the circuit board 10. The leads then make contact with metal trace patterns on the circuit board 10 to connect the electrical components into an electrical circuit.

The leads on individual components may be either high voltage connections or low voltage connection. For instance, leads 36, 38, 40 of chip module 34, leads 42, 44, 46 of chip module 32 and leads 48, 50, 52 of chip module 30 are high voltage leads. Leads 70, 72, 74 of chip module 34, leads 64, 66, 68 of chip module 32 and leads 58, 60, 62 of chip module 30 are all low voltage leads.

Diodes 20, 22, 24, 26 each have two leads, both of which are high voltage leads. Diode 20 has leads 76, 78 diode 22 has leads 80, 82, diode 24 has leads 84, 86 and diode 26 has leads 88, 90. The optoisolator 28 has 4 leads 92, 94, 96, 98. Two leads 92, 94 are high voltage leads and two leads 96, 98 are low voltage leads.

Figure 3:
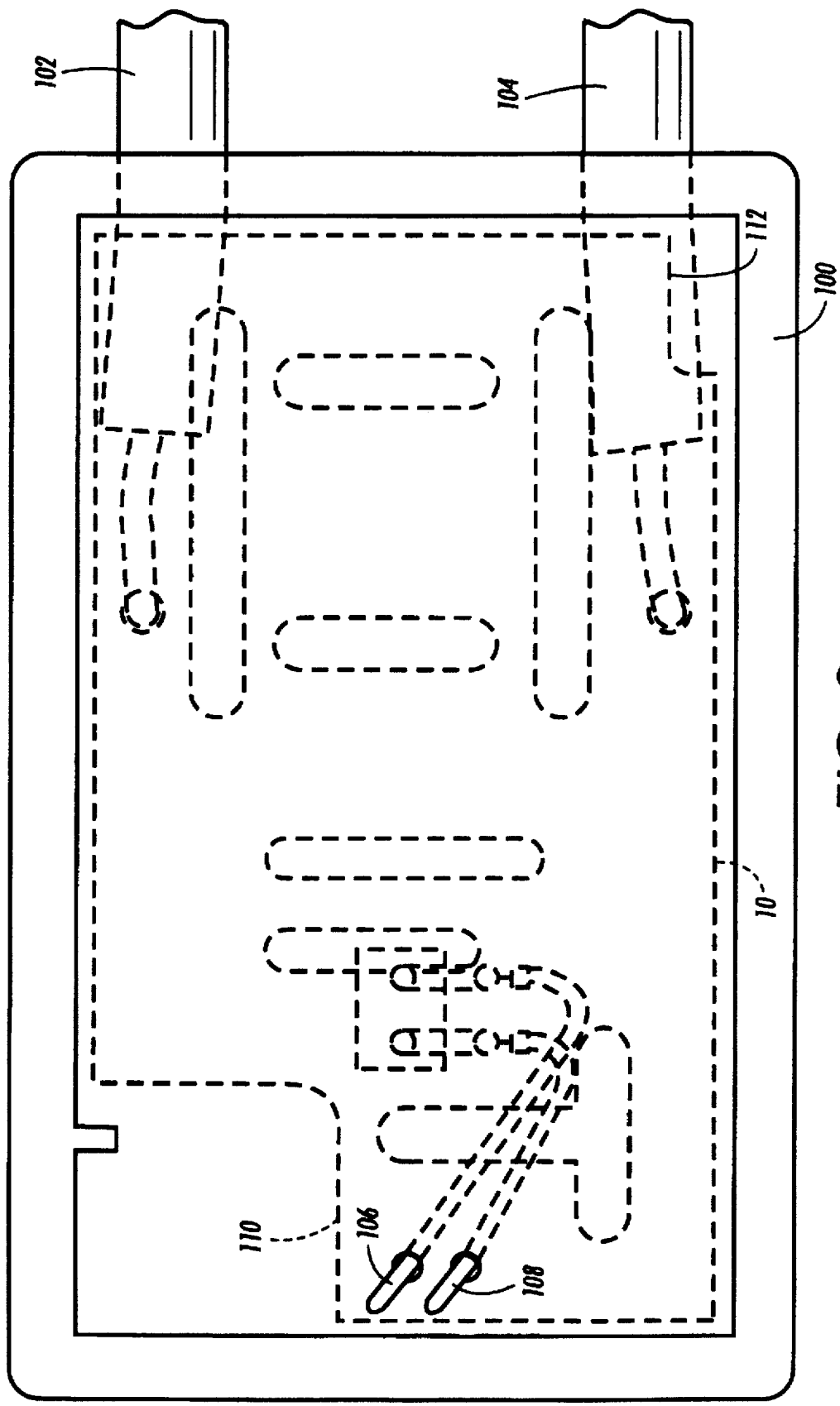
FIG. 3 is a bottom view of a housing with the circuit board of FIG. 2 inserted inside the housing.
Figure 4:
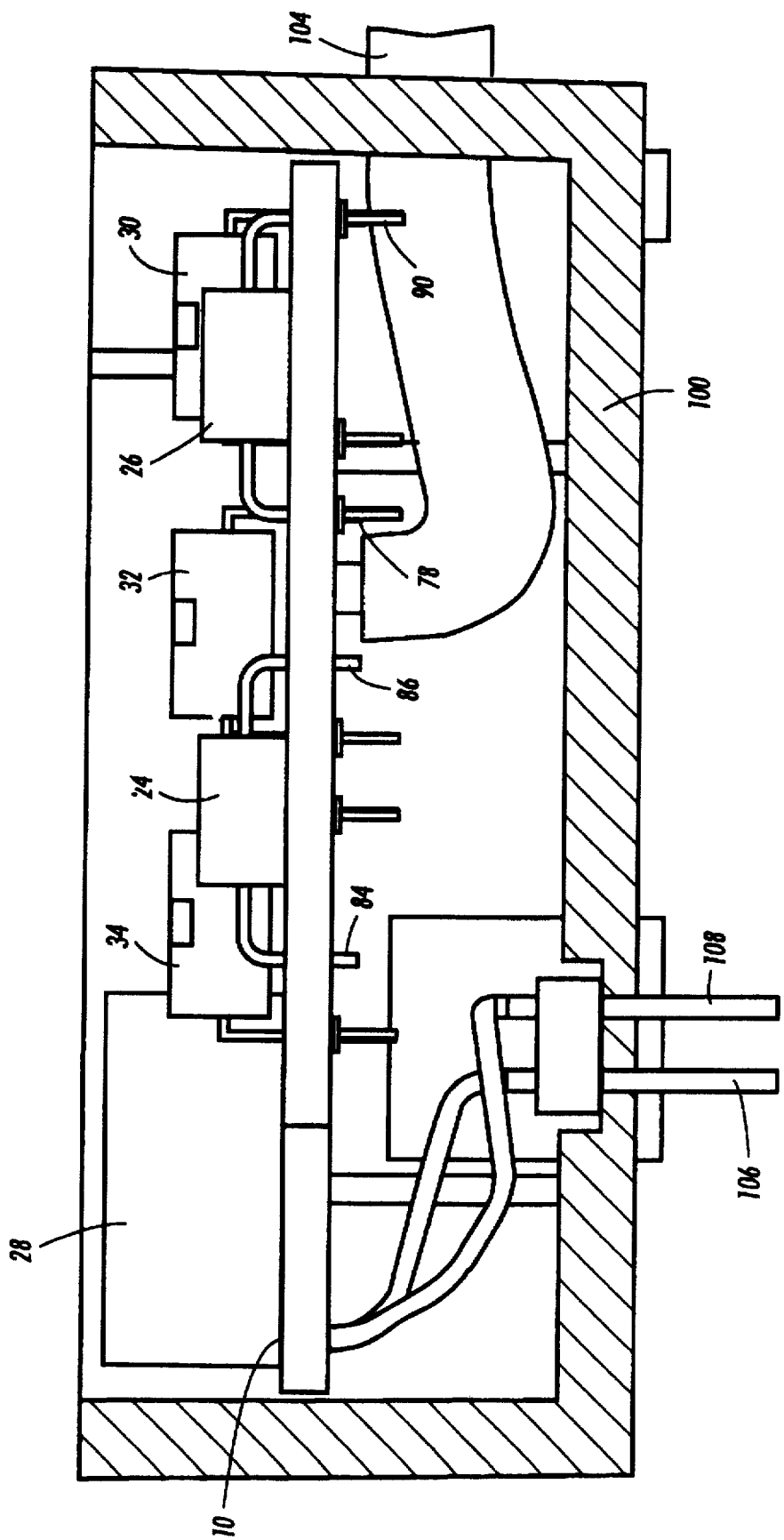
FIG. 4 is a cross sectional view of the housing shown in FIG. 3 with the circuit board of FIG. 2 inserted inside the housing.

FIGS. 3 and 4 show the circuit board 10 fitting within a housing 100. Wires 102, 104, 106, 108 exit through the housing 100 to provide electrical connections to the electrical components on the circuit board 10.

Two corners of circuit board 10 have been cut away leaving a notch 110 and a notch 112 in circuit board 10. The notches 110, 112 leave a significant gap between the circuit board 10 and the housing 100 (FIG. 3).

After the circuit board 10 has been assembled and inserted into the housing 100, a standard potting material is injected into the housing 100 and cured. The design of the circuit board 10 has several features that allow reliance on the dielectric strength of the potting material to support the high voltage requirements of the circuit board 10 instead of relying on the inadequate dielectric strength of the circuit board 10 itself. The circuit being designed has isolation requirements between the low voltage terminals and the high voltage terminals of approximately 7-10 Kv AC. These requirements were much greater than the circuit board alone could provide between the chip modules 30, 32, 34 and the optoisolator 28 themselves given the space requirements of the final assembly of the circuit board 10 in the housing 100.

One of these features, designed to improve the isolation between the chip modules 30, 32, 34, diodes 20, 22, 24, 26 and the optoisolator 28, is the elongated holes 14, the t-shaped hole 16, and the notches 110, 112. The elongated holes 14, the t-shaped hole 16 and the notches 110, 112 help insure that the potting material will flow easily around the circuit board 10 as well as between the circuit board 10 and the chip modules 30, 32, 34, diodes 20, 22, 24, 26 and the optoisolator 28.

Figure 5:
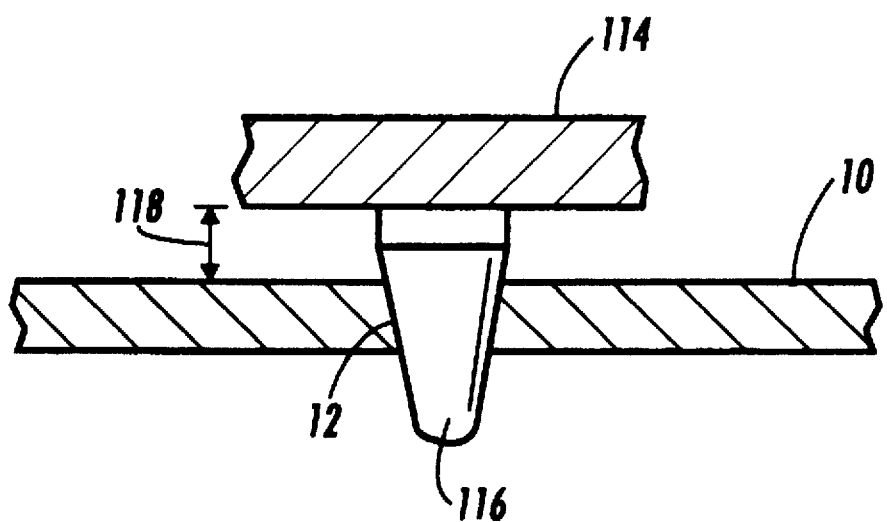
FIG. 5 is a cross sectional view of a portion of a circuit board showing how a chip is inserted into the circuit board.

Another feature that helps to insure that the potting material will flow easily can be seen in FIG. 5. FIG. 5 shows a cross section of circuit board 10, a hole 12 through the circuit board 10 with a lead 116 of a chip 114 inserted into the hole 12. The lead 116 of the chip 114 has slanted edges so that the diameter at the chip 114 end of the lead 116 is larger than the diameter of the other end of the lead 116. The hole 12 has a diameter that is less than the largest diameter of the lead 116. When the lead 116 of the chip 112 is inserted into the hole 12, it will only go part way through the hole 12. As the larger diameter end of the lead 116 tries to go through the hole, it will be prevented from doing so. The result is that the chip 114 will retain a gap 118 between the circuit board 10 and the chip 114. The example shown in FIG. 5 applies to all chips inserted in circuit board 10 as a means to provide a gap between the circuit board 10 and the chips.

By making it possible for the potting material to completely surround and encapsulate the circuit board 10, the chip modules 30, 32, 34, diodes 20, 22, 24, 26 and the optoisolator 28, these features provide high voltage protection greater than available on the circuit board 10 alone or using the potting compound with the circuit board 10 but without the elongated holes 14, the t-shaped holes 16, the notches 110, 112 and gap 118. This is because the potting material is now in direct contact with the high and low voltage nodes. Because the potting material has a higher dielectric strength, the potting material can provide the required isolation between the high and low voltage areas of the circuit board 10.

It is extremely important that the potting material flow smoothly around the circuit board 10, the chip modules 30, 32, 34 and the optoisolator 28 completely encapsulating the circuit board 10, the chip modules 30, 32, 34 and the optoisolator 28 without leaving bubbles, voids or micro air spaces within the potting material. Micro air spaces left within the potting material will ionize at the high voltages being used. Any ionized micro air spaces will then act as an arcing path between the nodes ultimately destroying any of the chip modules 30, 32, 34, diodes, 20, 22, 24, 26 or the optoisolator 28. The notch 110 is made large enough to insert a potting material dispensing needle through the notch 110. This allows the potting material to be injected underneath the circuit board 10 and to fill the housing 100 from the bottom up to the top of the housing 110. Filling the housing 100 from the bottom up allows for better filling of the potting material into the housing 100 and eliminates voids that might form if the housing was injected from the top. This is because the natural flow of the potting material itself is insufficient to fill the housing 100 completely without leaving voids in the potting material. The notch 112 is to facilitate flow of the potting material up through the housing 100.

Additionally, the elongated holes 14 and the t-shaped hole 16 are also placed to physically separate high voltage areas on the circuit board 10 from low voltage areas on the circuit board 10. The elongated holes 14 and the t-shaped hole 16 then also prevent charge migration between high voltage areas and low voltage areas on the circuit board 10 because of their placement between the high voltage areas and the low voltage areas. Preventing charge migration enhances the board's functional latitude and reliability under high voltage conditions.

Another feature in the design of the circuit board 10 that enables it to support high voltage circuits is the front side metal interconnect lines 6 and the back side metal interconnect lines 8. A double layer circuit board 10 is used and the front side metal interconnect lines 6 are used for both the high voltage interconnect lines and some of the low voltage interconnect lines while the back side metal interconnect lines 8 are used for only low voltage interconnect lines. The back side metal interconnect lines 8 are used to separate low voltage lines from certain high voltage lines when they needed to cross each other. The circuit board 10 is laid out to minimize instances of low and high voltage lines crossing each other. In this instance, it can be seen that there are only two back side metal interconnect lines 8. When both high and low voltage components are present in small spaces it becomes critical that as much separation as possible be obtained between the high and low voltage components, wires and routing. This has been important for the routing on circuit board 10 and is also true for the external connection wires, wires 102, 104, 106, 108. In this respect, notch 110 serves one more purpose. It allows for a window to view the wires 106, 108 after circuit board 10 has been inserted into the housing 100 and insures that the wires 106, 108 have been set correctly within the housing. This inspection allows detection and correction of any problems that would occur if the wires 106, 108 have been incorrectly set into the housing and are too close to the high voltage areas of the circuit board 10.

We claim:

1. An electronic circuit package comprising
   a) a circuit board having a top surface,
   b) at least one high voltage component attached to said circuit board and spaced from said circuit board top surface,
   c) at least one low voltage component attached to said circuit board and spaced from said circuit board top surface, said circuit board having at least one opening beneath said at least one high voltage component, having at least one opening beneath said at least one low voltage component, and having at least one opening between said at least one high voltage component and said at least one low voltage component to prevent charge migration, and
   d) a housing, said circuit board being located within said housing, potting material within said housing completely surrounding said circuit board, said at least one high voltage component and said at least one low voltage component and said potting material further extending through each of said openings and completely between said top surface of said circuit board and said at least one high voltage component and completely between said top surface of said circuit board and said at least one low voltage component whereby each component is encapsulated by said potting material and each at least one high voltage component and at least one low voltage component are electrically isolated from each other.

* * * * *